(12) United States Patent
Anderson (10) Patent No.: US 11,451,194 B2
(45) Date of Patent: Sep. 20, 2022

(54) AUTOMATIC FREQUENCY SHIFT COMPENSATION (AFSC) IN RESONANT TANK CIRCUITS OVER THE PROCESS VARIATION

(71) Applicant: DSP Group Ltd., Herzliya (IL)

(72) Inventor: Sergey Anderson, Netanya (IL)

(73) Assignee: DSP Group Ltd., Herzliya (IL)

(*) Notice: Subject to any disclaimer, the term of this patent is extended or adjusted under 35 U.S.C. 154(b) by 92 days.

(21) Appl. No.: 17/103,880

(22) Filed: Nov. 24, 2020

(65) Prior Publication Data

US 2021/0184631 A1 Jun. 17, 2021

Related U.S. Application Data

(60) Provisional application No. 62/942,071, filed on Nov. 30, 2019.

(51) Int. Cl.
| | |
|---|---|
| *H03F 3/45* | (2006.01) |
| *H03F 1/02* | (2006.01) |
| *H03F 3/193* | (2006.01) |
| *H03F 1/56* | (2006.01) |

(52) U.S. Cl.
CPC ............. *H03F 1/0205* (2013.01); *H03F 1/56* (2013.01); *H03F 3/193* (2013.01); *H03F 2200/225* (2013.01); *H03F 2200/294* (2013.01)

(58) Field of Classification Search
CPC ........................................................ H03F 3/45
USPC ......................................... 330/252, 253, 261
See application file for complete search history.

(56) References Cited

U.S. PATENT DOCUMENTS

| | | | |
|---|---|---|---|
| 9,590,561 B2 * | 3/2017 | Cai | ........................ H03F 3/21 |
| 9,813,033 B2 * | 11/2017 | Testi | .................. H03F 3/45188 |
| 2013/0093516 A1 * | 4/2013 | Paul | ...................... H03F 1/086 |
| | | | 330/253 |

* cited by examiner

*Primary Examiner* — Henry Choe
(74) *Attorney, Agent, or Firm* — Reches Patents (57) ABSTRACT

A low noise amplifier that may include a first input port, a second input port, a first capacitor, a second capacitor, a first variable capacitor, a second variable capacitor, an inductor, a bias circuit, a tuning circuit, a first output circuit having a first output, a second output circuit having a second output; wherein the first input port is electrically coupled to a first end of the second variable capacitor, to a first end of the first capacitor, to an input of the first output circuit, and to a first port of the inductor; wherein the second input port is electrically coupled to a second end of the first variable capacitor, to a second end of the second capacitor, to an input of the second output circuit, and to a second port of the inductor; wherein a first port of the first varactor is electrically coupled to a second end of the first capacitor; wherein a second port of the second varactor is electrically coupled to a first end of the second capacitor; wherein the bias circuit is configured to supply a bias voltage to a third port of the inductor; and wherein the tuning circuit is configured to control a capacitance of the first varactor and a capacitance of the variable capacitor.

12 Claims, 9 Drawing Sheets

| corner | Vgs [mV] | Vth [mV] | Vgs-Vth [mV] |
|---|---|---|---|
| ss | 440.5 | 516.2 | -75.7 |
| tt | 422.6 | 493.5 | -70.9 |
| ff | 404.1 | 469.6 | -65.5 |

| corner |  crtmom [fF] @ 2.4G |  varactor [fF] @ 2.4G |
|---|---|---|
| ss | 293 | 225 |
| tt | 243 | 240 |
| ff | 192 | 254 |
| C var [fF] | 101 | 29 |
| C var [%] | 42 | 12 |

AUTOMATIC FREQUENCY SHIFT COMPENSATION (AFSC) IN RESONANT TANK CIRCUITS OVER THE PROCESS VARIATION

CROSS REFERENCE

This application claims priority from U.S. provisional patent application 62/954,071 filing date Nov. 30, 2019 which is incorporated herein by reference.

BACKGROUND

All wireless mobile devices (DECT, GSM, 3G, LTE, WiMax, Wi-Fi 802.11 n/ac, ULE 802.11ah etc.) including low noise amplifiers (LNAs) and Voltage Control Oscillators (VCOs) require stable over process tank resonant circuits—which are tank resonant circuits that are stable despite process variations.

Figure 1:
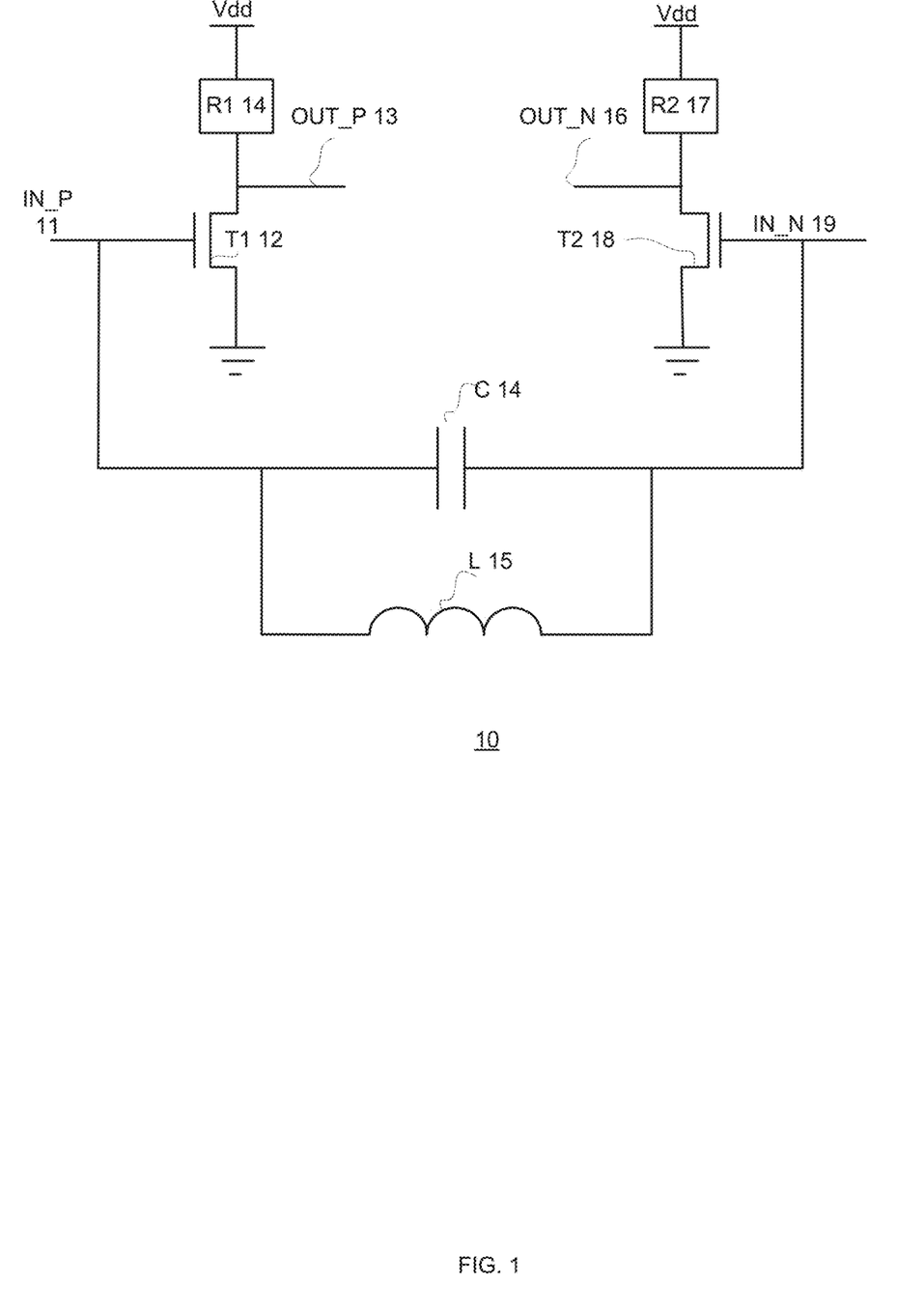
FIG. 1 illustrates an example of a prior art amplifier.

FIG. 1 illustrates a prior art amplifier topology 10 with a CRTMOM (an inter-digitated metal-oxide-metal multi-finger capacitor formed by multiple metal layers) C 14 at the input. Capacitor C 14 and inductor L 15 are coupled in parallel to each other between first input port IN_P 11 and second input port IN_N 19.

The first input port IN_P 11 is connected to first transistor T1 12 of a first output circuit that also includes a first resistor R1 14, and a first output port OUT_P 13.

The second input port IN_N 19 is connected to second transistor T2 18 of a second output circuit that also includes a second resistor R2 17 and a second output port OUT_N 16.

Figure 2:
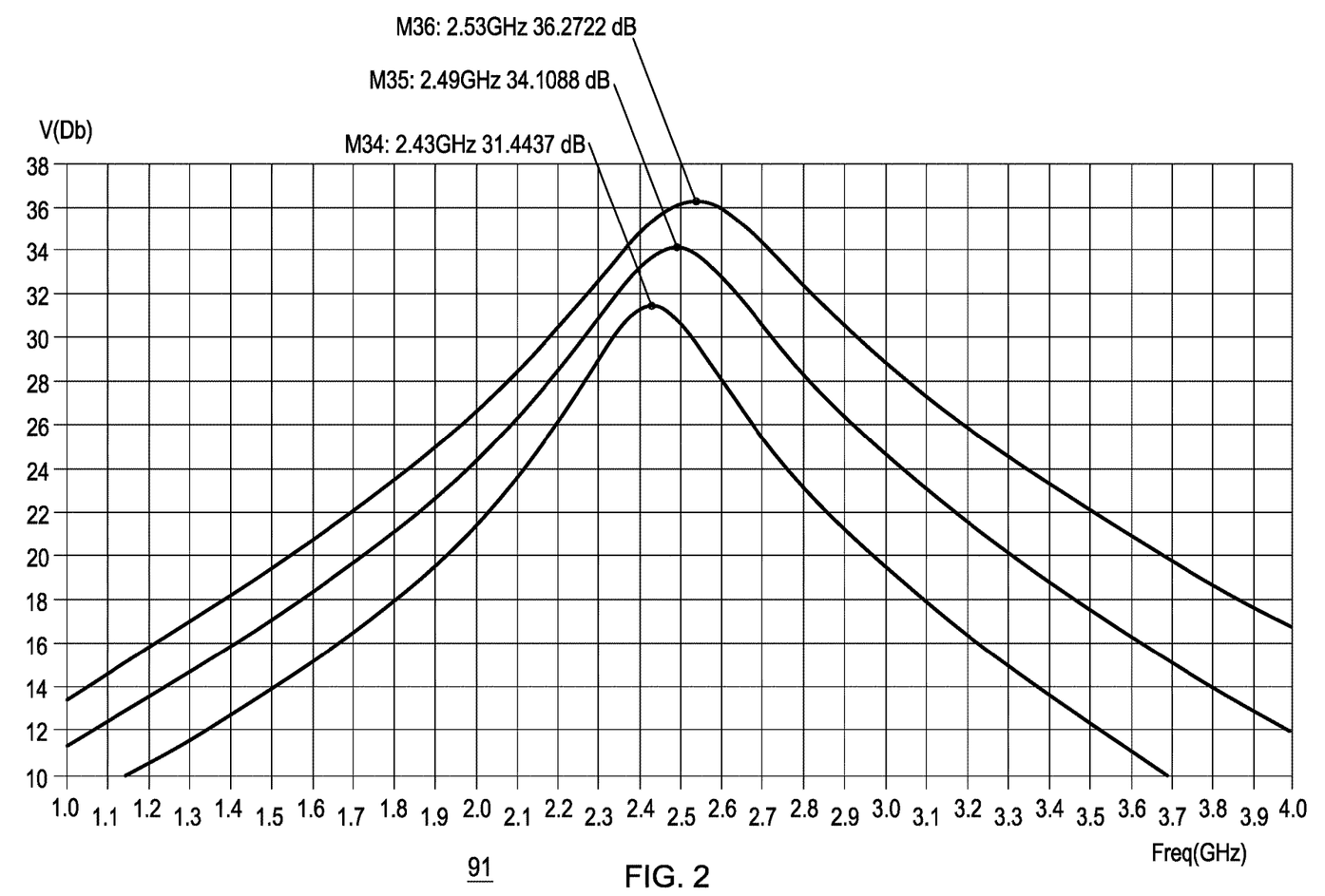
FIG. 2 illustrates an example of a simulation.

FIG. 2 illustrates a simulation of a CRTMOM capacitor based amplifier topology simulation results over process variation. The simulation illustrates substantial difference in the response of the circuit at the presence of process variations. In FIG. 2—the X-axis represents the frequency band in GHz and Y-axis represents the amplitude response (voltage gain) in dB of the amplifier over the frequency band.

In FIG. 2 M34 is an amplifier amplitude response related to the slow-slow (ss) process variation corner with maximum voltage gain of 31.44 dB at 2.43 GHz. M35 is an amplifier amplitude response related to the typical-typical (tt) process variation corner with maximum voltage gain of 34.1 dB at 2.49 GHz. M36 is an amplifier amplitude response related to the fast-fast (ff) process variation corner with maximum voltage gain of 36.27 dB at 2.53 GHz.

There is a need to control and compensate frequency drifts over the process variation, especially for the Low Power CMOS process.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

DETAILED DESCRIPTION OF THE DRAWINGS

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

Any reference in the specification to a system should be applied mutatis mutandis to a method that can be executed by the system.

Because the illustrated at least one embodiment of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method.

Figure 3:
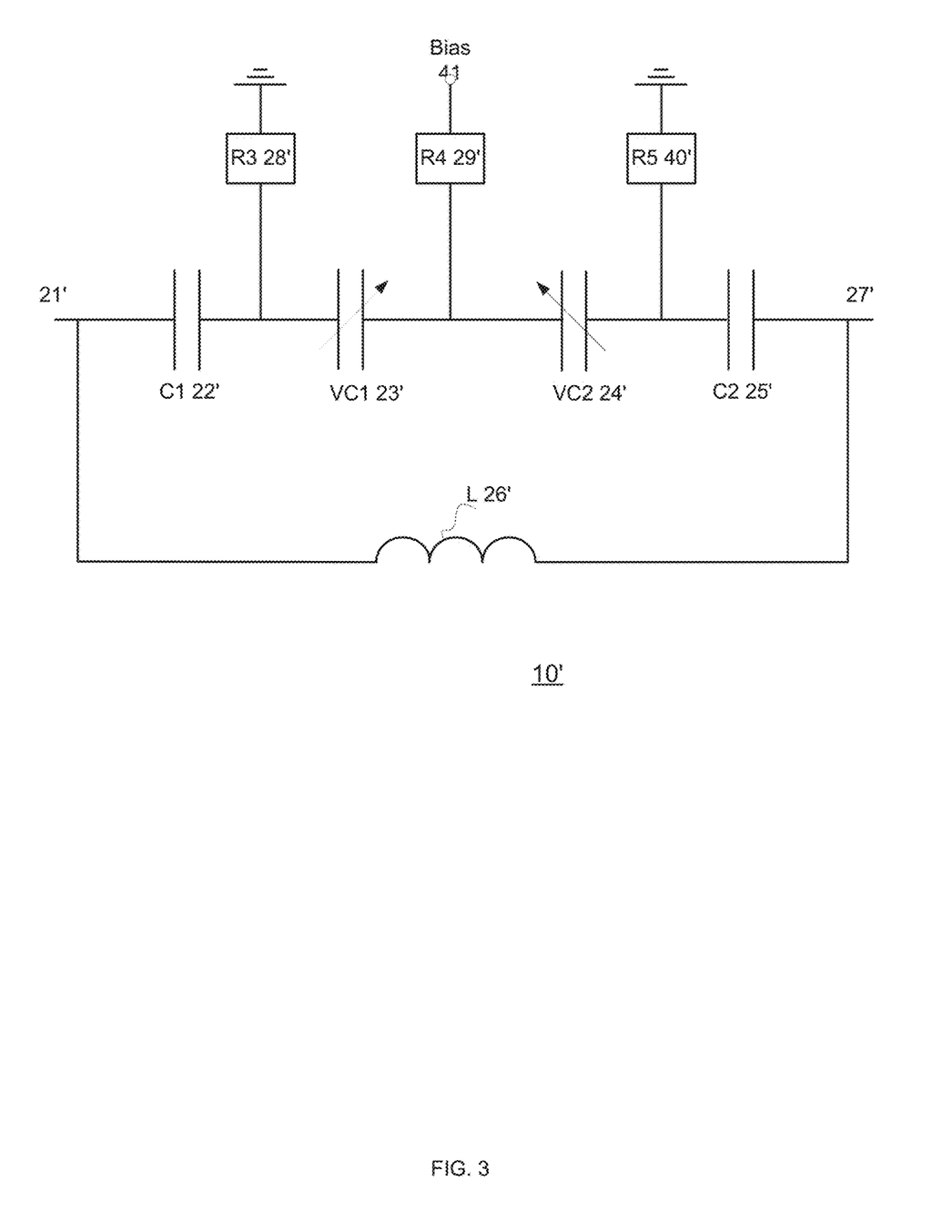
FIG. 3 illustrates a resonant circuit.

FIG. 3 illustrates a circuit 10' in which frequency drifts are compensated in the resonant tank circuit by connecting varactors (variable capacitors) and capacitors in series.

The circuit 10' includes a first input port 21' and a second input port 27'.

Inductor L 26' is connected between the first and second input ports.

A first end of first capacitor C1 22' is connected to first input port 21'.

A second end of first capacitor C1 22' is connected to a first end of first varactor VC1 23' and to a first end of third resistor R3 28'. A second end of third resistor R 28' is grounded.

A second end of first varactor VC1 23' is connected to a first end of second varactor VC2 24' and to a first end of fourth resistor R4 29'. A second end of fourth resistor R4 29' receives bias voltage 41.

A second end of second varactor VC2 24' is connected to a first end of second capacitor V2 25' and to a first end of fifth resistor R5 40'. A second end of fifth resistor R5 40' is grounded.

A second end of second capacitor C2 25' is connected to second input port 27'.

However, circuit 10' requires almost four times larger values of the capacitors and varactors in order to achieve required total capacitance because of their series connection. This solution also requires additional bias circuit in order to compensate capacitors and varactors changes over the process variation.

There may be provided an Automatic Frequency Shift Compensation (AFSC) circuit that provides control and auto-compensation of the frequency drift in the resonant tank circuits over the process variation.

The suggested AFSC circuit may be based on self-compensation effect of series connected CRTMOM capacitors with varactors by adding a new biasing form to the latest one.

Typical connection of varactors and capacitors in series requires additional biasing control and increases capacitors/varactors physical values in order to achieve the same compensation effect as for the AFSC circuit.

The suggested low noise amplifier can be easily integrated into any Front-End/Transceiver without penalties in current consumptions or silicon die size.

Figure 4:
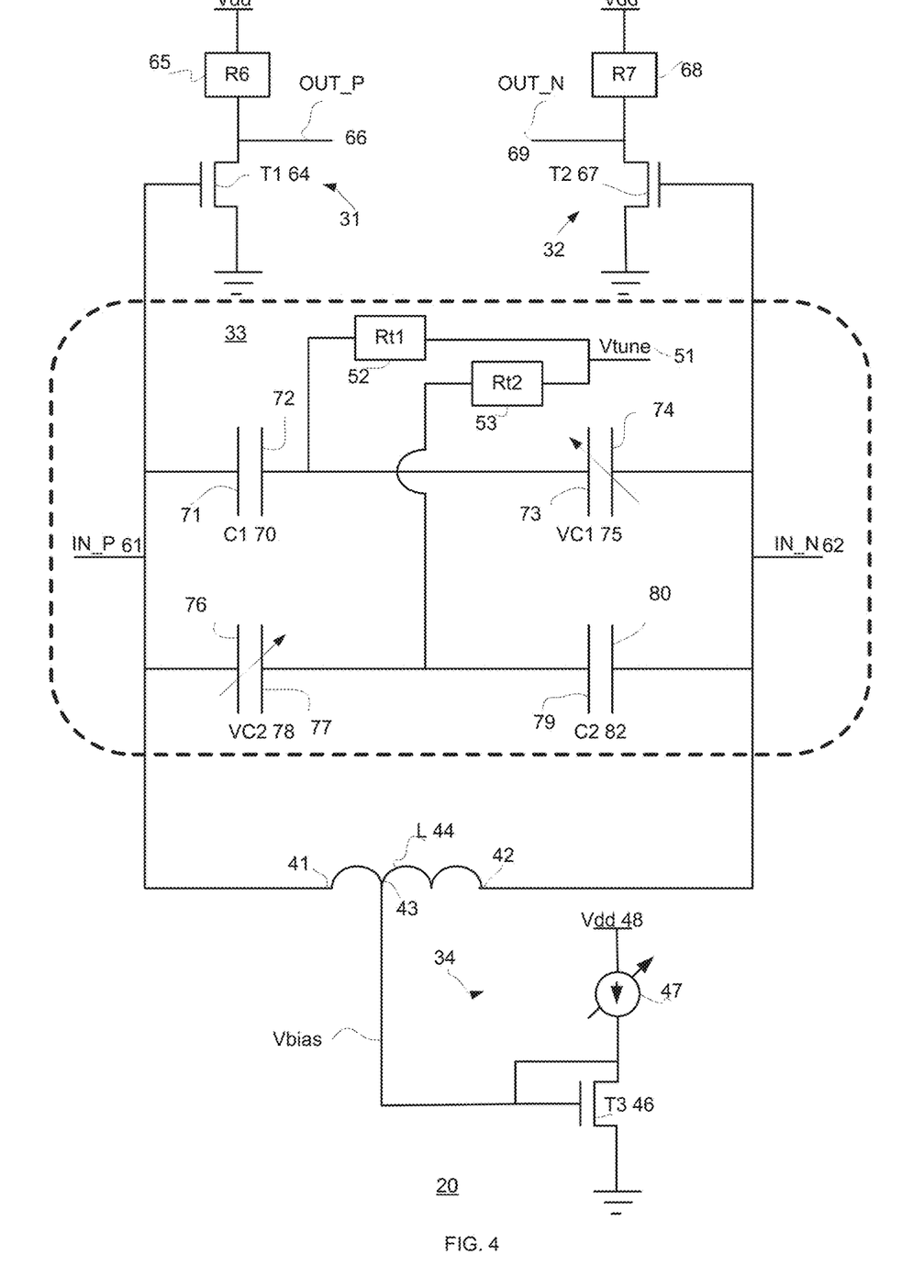
FIG. 4 illustrates an example of a circuit.

FIG. 4 illustrates a low noise amplifier 20 that includes a first input port (IN_P) for receiving a first input, and second input port (IN_N) for receiving a second input.

The low noise amplifier includes an automatic frequency shift compensation (AFSC) circuit 33 that includes first capacitor C1 70, second capacitor C2 82, first varactor VC1, 75, second varactor VC2 78, first tuning resistor Rt1 52, and second tuning resistor Rt2 53 (which are fed by voltage source Vtune 51 for tuning the resonance of the tank circuit by changing capacitance of the first and second variable capacitors VC1 and VC2 for initial operation conditions of the amplifier).

AFSC circuit 33 and inductor L 44 for a resonant tank which are used as an input matching circuit of the amplifier.

There are several sources of process variations for the modern CMOS technologies, such as: Gate Oxide thickness variation ($T_{OX}$), Random Doping Fluctuations, Device Geometry variation due to lithography inaccuracy and etc. All these effects have strong influence on both parameters of the transistor (transistor threshold voltage ($V_T$), sub-threshold current, leakage, power, frequency) and other components like resistors, inductors, capacitors and varactors. As example, multi-finger capacitor CRTMOM formed by multiple metal layers could have ±20% deviation of the capacitance value over the process variation.

Figure 7:
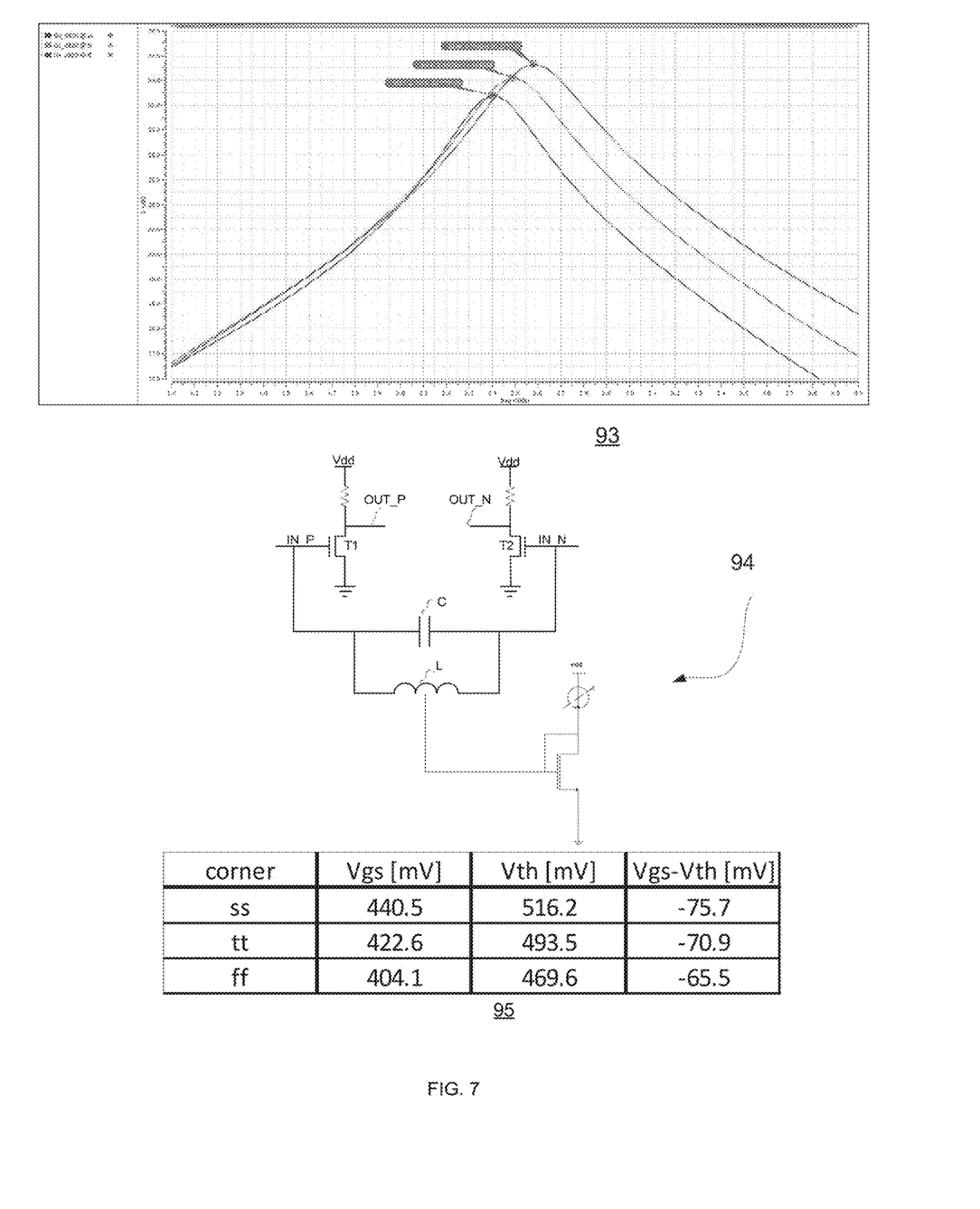
FIG. 7 illustrates an example of a simulation.

The amplifier performance could be improved by adding a diode-connected transistor (T3) for biasing supply of the amplifier for stabilizing the operation point of the transistors over the process variation. This may decrease the voltage gain variation of the amplifier, but may increase the frequency drifts over the process variation, as shown in FIG. 7—illustrating simulations results 93, a simplified circuit model 94 used during the simulations and parameters 95 for different process variations.

Figure 8:
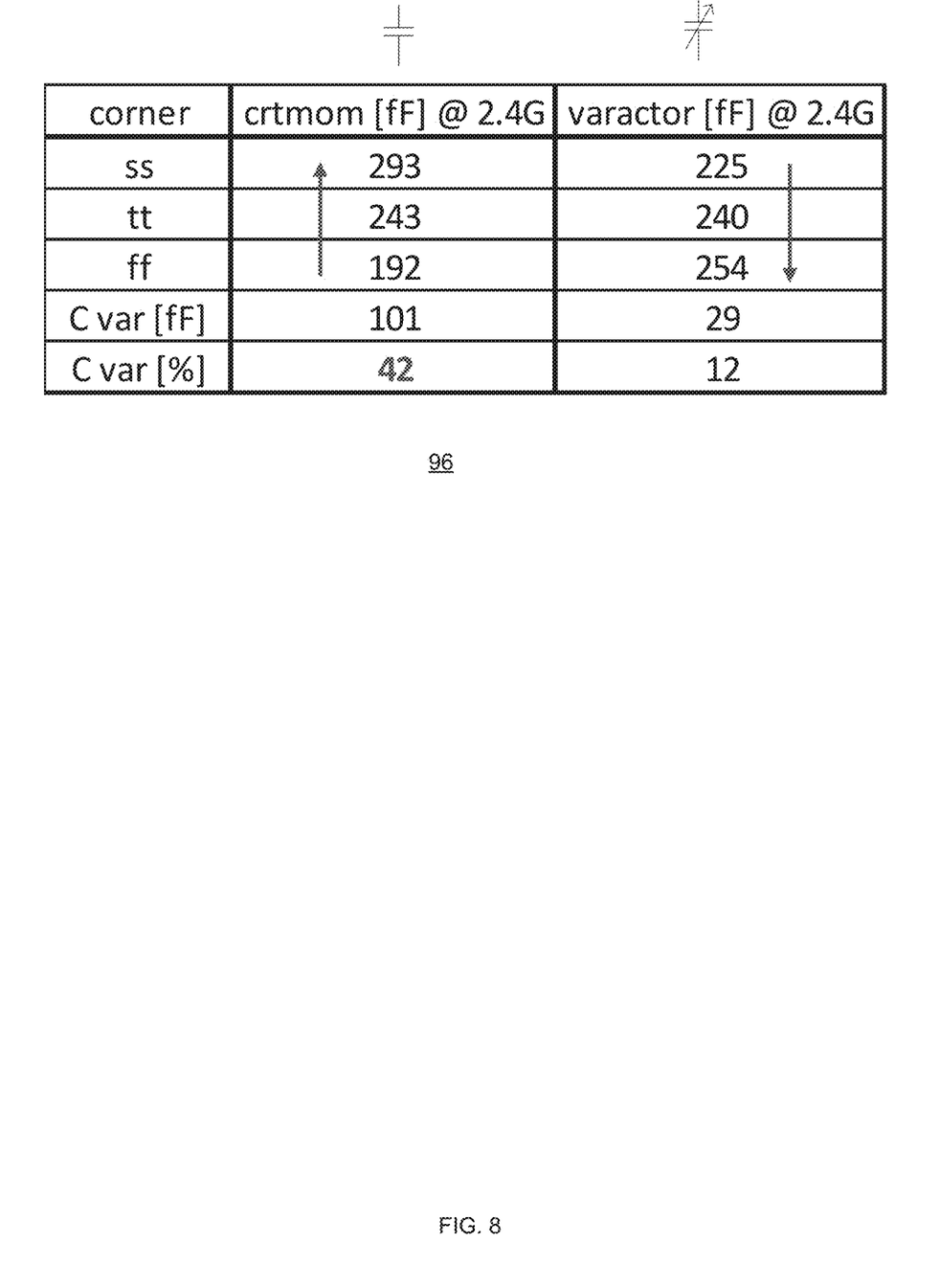
FIG. 8 illustrates the parameters of a varactor and of a CTRMOM capacitor.

There are two types of capacitors available for TSMC CMOS bulk process: CRTMOM and varactor. Their capacitor value behavior over process variation is different, as it shown in table 96 of FIG. 8. Obviously, value and sign of slope gradients of the CRTMOM and varactor capacitances are divergent over the process variation. Therefore, using series connection of the CRTMOM and varactor capacitors (per branch) could improve a compensation effect for capacitance variation over the process variation.

In addition—applying the same biasing voltage created by diode-connected transistor (T3 46) to both amplifier transistors (T1 and T2) and to varactors VC1 and VC2 within the AFSC circuit 33 of FIG. 4 creates a process variation compensation regime for the varactors over process variation.

The first input port 61 and the second input port 62 may get the same DC voltage potential for correct operation of the circuit. The first and second input ports can be regarded as first and second input ports of the AFSC circuit 33.

The AFSC circuit 33 may include a first branch and a second branch that are coupled in parallel to each other and between the first input port 61 and the second input port 62.

The first branch includes a first capacitor C1 70 and first varactor VC1 75 that are serially coupled to each other.

The second branch includes a second varactor VC2 78, and second capacitor C2 82 that are serially coupled to each other.

Second varactor VC2 and first capacitor C1 have first ends connected to first input port. First varactor VC1 and second capacitor C2 have second ends connected to the second input port.

The first and second branches are connected in parallel to each other so that the overall capacitance is a sum of the capacitance of the first branch and a capacitance of the second branch.

A second end of first capacitor C1 and a first end of first varactor VC1 are connected at a first intermediate node to the first tuning resistor Rt1.

First end of second capacitor C2 and second end of second varactor VC2 are connected at a second intermediate node to a second tuning resistor Rt2.

First and second resistors are coupled in parallel to a variable voltage source Vtune 51.

Inductor L 44 has three nodes—first port 41 at one end, second port 42 at another end, and third node 43 at an internal point of the inductor. The first and second input ports 61 and 62 are connected the first and second ports 41 and 42. The third node 43 is coupled to a bias voltage source 34 for receiving bias voltage Vbias. The bias voltage source 34 is illustrates as including a third transistor T3 46 connected as a diode, and a variable current source 47.

A first output transistor T1 64 of a first output circuit 31 is connected to the first input port and output a first voltage OUT_P 66. FIG. 4 illustrates the first output circuit 31 as also including a sixth resistor R6 65.

A second output transistor T2 67 of a second output circuit 32 is connected to the second input port and output a second voltage OUT_N 69. FIG. 4 illustrates the second output circuit 32 as also including a seventh resistor R7 68.

Figure 5:
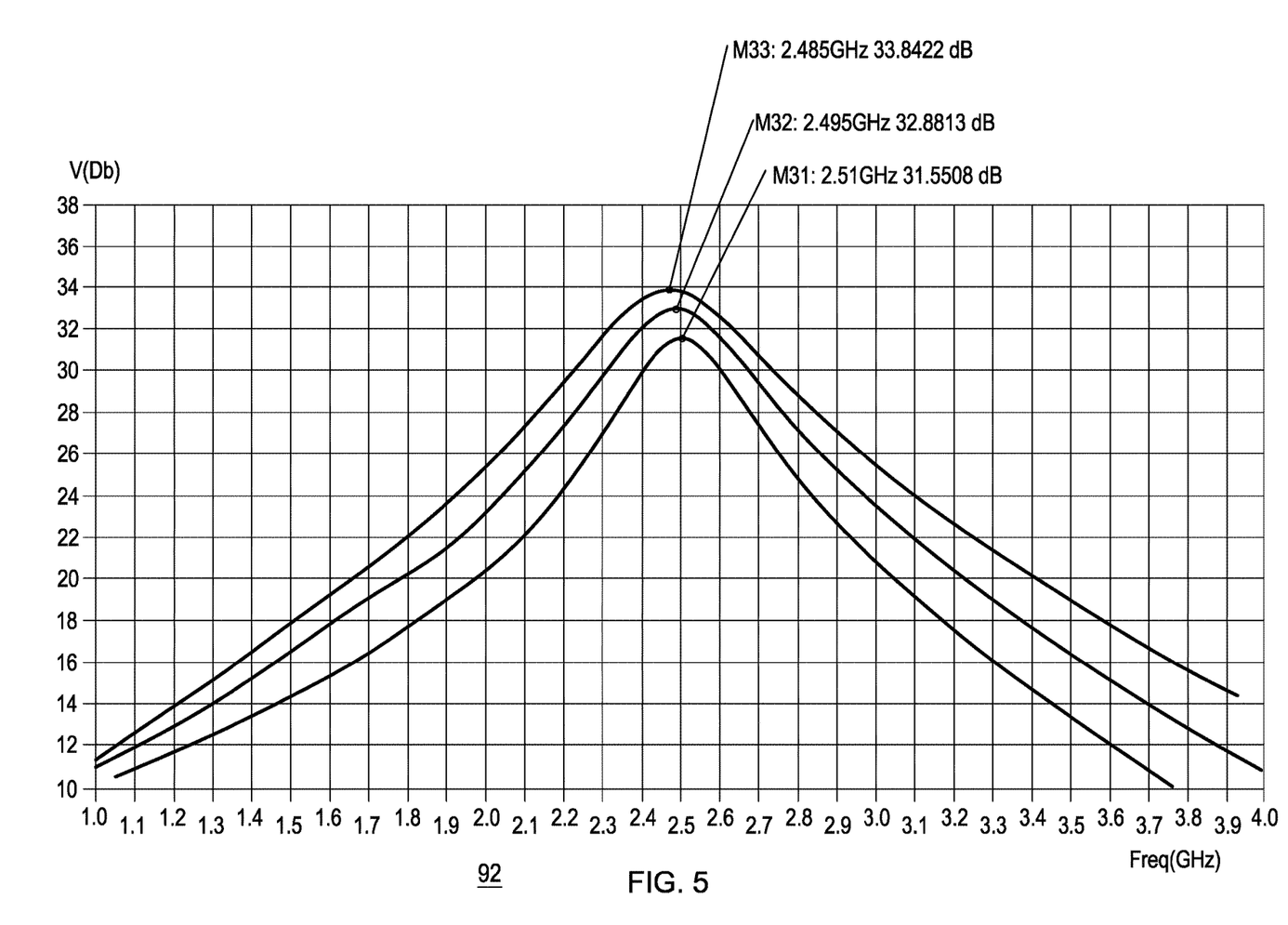
FIG. 5 illustrates a result of a simulation.
Figure 6:
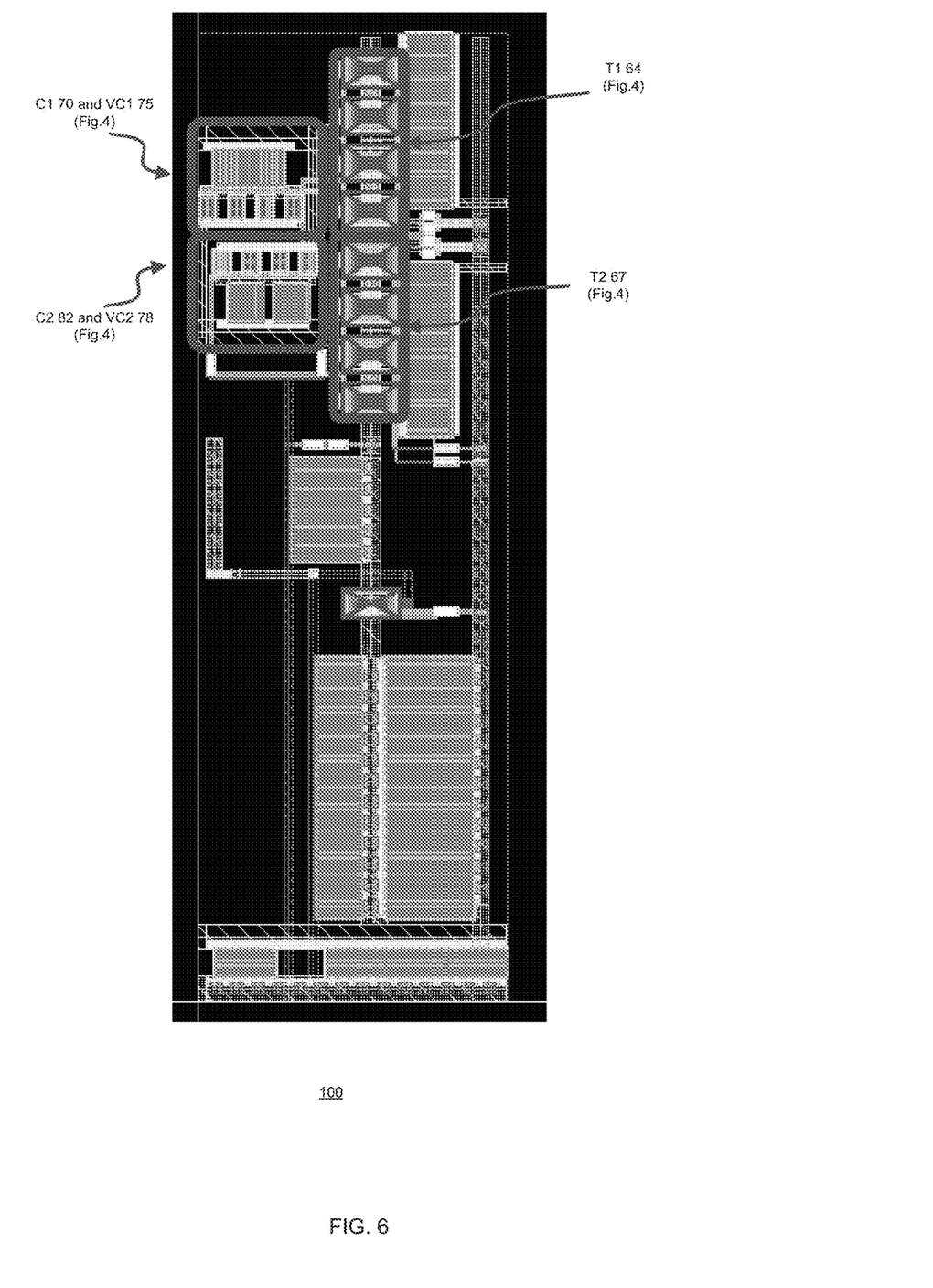
FIG. 6 illustrates a circuit.

FIG. 5 illustrates a simulation 92 of low noise amplifier 20—over process variation. The simulation illustrates much smaller differences in the response of the circuit at the presence of process variations FIG. 6 illustrates a layout of the low noise amplifier of FIG. 4.

For simplicity of explanation—reference numbers of some various components (such as C1 70, VC1 75, T1 64, C2 82, T2 67, C2 82, VC2 78) were shown.

Figure 9:
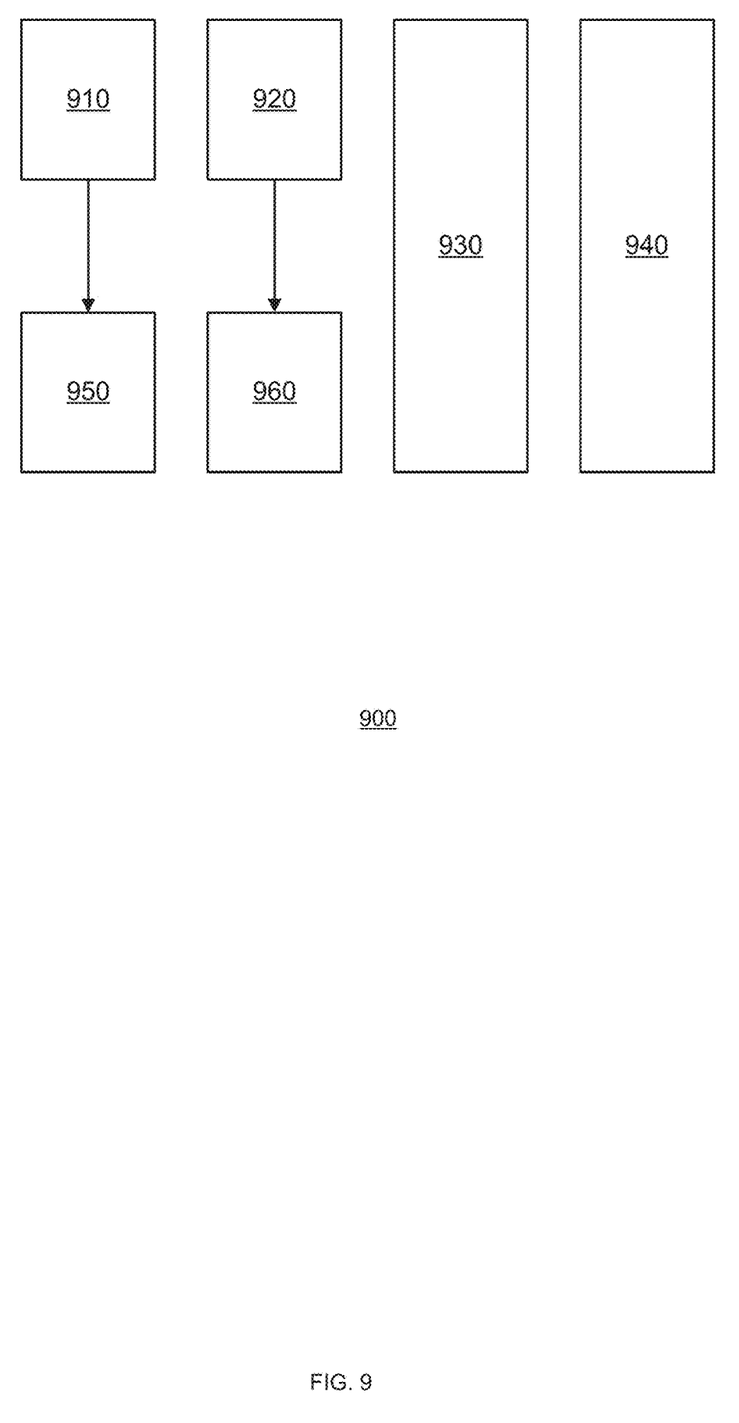
FIG. 9 illustrates an example of a method.

FIG. 9 illustrates method 200.

Method 200 may start by steps 210, 220, 230 and 240.

Step 210 may include providing a first input signal to a first output circuit, to a first input port of an automatic frequency shift compensation circuit and to a first port of an inductor.

The automatic frequency shift compensation circuit may include a first capacitor, a second capacitor, a first variable capacitor, a second variable capacitor and a tuning circuit; wherein the first input port is electrically coupled to a first end of the second variable capacitor, to a first end of the first capacitor, to an input of the first output circuit, and to a first port of the inductor; wherein the second input port is electrically coupled to a second end of the first variable capacitor, to a second end of the second capacitor, to an input of the second output circuit, and to a second port of the inductor; wherein a first port of the first varactor is electrically coupled to a second end of the first capacitor; wherein a second port of the second varactor is electrically coupled to a first end of the second capacitor.

Step 220 may include providing a second input signal to a second output circuit, to a second input port of the automatic frequency shift compensation circuit, and to a second port of the inductor.

Step 230 may include biasing the inductor via a third port, by a bias circuit.

Step 240 may include controlling, by the tuning circuit, a capacitance of the first varactor and a capacitance of the variable capacitor.

Steps 210 may be followed by step 250 of amplifying the first input signal by the first output circuit to provide a first output signal.

Step 220 may be followed by step 260 of amplifying the second input signal by the first output circuit to provide a second output signal.

Any of the figures may or may not be in scale.

Any reference to any of the terms "comprise", "comprises", "comprising" "including", "may include" and "includes" may be applied to any of the terms "consists", "consisting", "and consisting essentially of".

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Those skilled in the art will recognize that the boundaries between MEMS elements are merely illustrative and that alternative embodiments may merge MEMS elements or impose an alternate decomposition of functionality upon various MEMS elements. Thus, it is to be understood that the architectures depicted herein are merely exemplary, and that in fact many other architectures can be implemented which achieve the same functionality.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations are merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single MEMS device. Alternatively, the examples may be implemented as any number of separate MEMS devices or separate MEMS devices interconnected with each other in a suitable manner. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

I claim:

1. A low noise amplifier, comprising:
a first input port, a second input port, a first capacitor, a second capacitor, a first variable capacitor, a second variable capacitor, an inductor, a bias circuit, a tuning circuit, a first output circuit having a first output, a second output circuit having a second output;
wherein the first input port is electrically coupled to a first end of the second variable capacitor, to a first end of the first capacitor, to an input of the first output circuit, and to a first port of the inductor;
wherein the second input port is electrically coupled to a second end of the first variable capacitor, to a second end of the second capacitor, to an input of the second output circuit, and to a second port of the inductor;
wherein a first port of the first varactor is electrically coupled to a second end of the first capacitor;
wherein a second port of the second varactor is electrically coupled to a first end of the second capacitor;
wherein the bias circuit is configured to supply a bias voltage to a third port of the inductor; and
wherein the tuning circuit is configured to control a capacitance of the first varactor and a capacitance of the variable capacitor.

2. The low noise amplifier according to claim 1 wherein the tuning circuit comprises a voltage source that is coupled in parallel, via resistors, to the first port of the first varactor and to the second port of the second variable capacitor.

3. The low noise amplifier according to claim 1 wherein the first port of the inductor is electrically coupled to a first end of the inductor, the second port of the inductor is electrically coupled to a second end of the inductor, and the third port of the inductor is electrically coupled to a point of the inductor located between the first port of the inductor and the second port of the inductor.

4. The low noise amplifier according to claim 1 consisting essentially of the first input port, the second input port, the first capacitor, the second capacitor, the first variable capacitor, the second variable capacitor, the inductor, the bias circuit, the tuning circuit, the first output circuit, and the second output circuit.

5. The low noise amplifier according to claim 1 consisting the first input port, the second input port, the first capacitor, the second capacitor, the first variable capacitor, the second variable capacitor, the inductor, the bias circuit, the tuning circuit, the first output circuit, and the second output circuit.

6. The low noise amplifier according to claim 1 wherein the bias circuit comprises a transistor that is connected as a diode.

7. A method for operating a low noise amplifier, the method comprises:
providing a first input signal to a first output circuit, to a first input port of an automatic frequency shift compensation circuit and to a first port of an inductor;
providing a second input signal to a second output circuit, to a second input port of the automatic frequency shift compensation circuit, and to a second port of the inductor;
biasing the inductor via a third port, by a bias circuit;
amplifying the first input signal by the first output circuit to provide a first output signal; and
amplifying the second input signal by the first output circuit to provide a second output signal;
wherein the automatic frequency shift compensation circuit comprises a first capacitor, a second capacitor, a first variable capacitor, a second variable capacitor and a tuning circuit; wherein the first input port is electrically coupled to a first end of the second variable capacitor, to a first end of the first capacitor, to an input of the first output circuit, and to a first port of the inductor; wherein the second input port is electrically coupled to a second end of the first variable capacitor, to a second end of the second capacitor, to an input of the second output circuit, and to a second port of the inductor; wherein a first port of the first varactor is electrically coupled to a second end of the first capacitor; wherein a second port of the second varactor is electrically coupled to a first end of the second capacitor; and
wherein the method further comprises controlling, by the tuning circuit, a capacitance of the first varactor and a capacitance of the variable capacitor.

8. The method according to claim 7 wherein the tuning circuit comprises a voltage source that is coupled in parallel, via resistors, to the first port of the first varactor and to the second port of the second variable capacitor.

9. The method according to claim 7 wherein the first port of the inductor is electrically coupled to a first end of the inductor, the second port of the inductor is electrically coupled to a second end of the inductor, and the third port of the inductor is electrically coupled to a point of the inductor located between the first port of the inductor and the second port of the inductor.

10. The method according to claim 7 wherein the low noise amplifier consist essentially of the first input port, the second input port, the first capacitor, the second capacitor, the first variable capacitor, the second variable capacitor, the inductor, the bias circuit, the tuning circuit, the first output circuit, and the second output circuit.

11. The method according to claim 7 wherein the low noise amplifier consists of the first input port, the second input port, the first capacitor, the second capacitor, the first variable capacitor, the second variable capacitor, the inductor, the bias circuit, the tuning circuit, the first output circuit, and the second output circuit.

12. The method according to claim 7 wherein the bias circuit comprises a transistor that is connected as a diode.

\* \* \* \* \*